(12) United States Patent
Egashira

(10) Patent No.: US 8,518,614 B2
(45) Date of Patent: Aug. 27, 2013

(54) MARK POSITION DETECTION APPARATUS

(75) Inventor: Shinichi Egashira, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 370 days.

(21) Appl. No.: 11/847,037

(22) Filed: Aug. 29, 2007

(65) Prior Publication Data

US 2008/0063956 A1 Mar. 13, 2008

(30) Foreign Application Priority Data

Sep. 11, 2006 (JP) .................................. 2006-245387

(51) Int. Cl.
- *G03C 5/00* (2006.01)
- *G01N 21/86* (2006.01)
- *H01L 21/02* (2006.01)

(52) U.S. Cl.
USPC .............................. 430/30; 250/548; 430/311

(58) Field of Classification Search
USPC ......... 430/30, 311, 22, 5; 356/401; 257/797; 250/548

See application file for complete search history.

(56) References Cited

U.S. PATENT DOCUMENTS

| | | |
|---|---|---|
| 5,120,974 A | 6/1992 | Muraki |
| 5,543,921 A | 8/1996 | Uzawa et al. |
| 2004/0010385 A1 * | 1/2004 | Fukuhara et al. ................ 702/83 |
| 2004/0033426 A1 * | 2/2004 | Den Boef et al. ................ 430/22 |
| 2004/0204901 A1 * | 10/2004 | Hayashi ........................ 702/150 |

FOREIGN PATENT DOCUMENTS

| | | |
|---|---|---|
| JP | 02-206706 A | 8/1990 |
| JP | 02-294015 A | 12/1990 |
| JP | 08-094315 A | 4/1996 |
| JP | 2004-103992 A | 4/2004 |
| JP | 2004-241633 A | 8/2004 |
| JP | 2004-241633 A | 8/2004 |
| JP | 2005-302785 A | 10/2005 |

* cited by examiner

*Primary Examiner* — Jonathan Jelsma

(74) *Attorney, Agent, or Firm* — Canon U.S.A., Inc. IP Divsion

(57) ABSTRACT

An apparatus for detecting a position of a mark from a mark signal obtained by capturing an image of the mark includes a signal processor. The signal processor is configured to set a processing window with respect to each of a plurality of positions relative to the mark signal, to calculate an even function intensity of the mark signal in the processing window with respect to each of the plurality of positions, and to detect the positions of the marks based on the even function intensity calculated with respect to each of the plurality of positions.

11 Claims, 16 Drawing Sheets

MARK POSITION DETECTION APPARATUS

BACKGROUND OF THE INVENTION

1. Field of the Invention

The present invention relates to techniques for detecting a position of a mark from a mark signal obtained by capturing an image of the mark. The present invention is applicable, for example, to an exposure apparatus used in fabrication processing of a device, such as a semiconductor device.

2. Description of the Related Art

In recent years, projection exposure apparatuses used in fabrication processing of semiconductor devices have been miniaturized and have been made in high density, and therefore, are required to perform projection exposure of a circuit pattern arranged on a reticle surface onto a surface of a wafer with comparatively high resolution. Projection resolution of the circuit pattern depends on a numerical aperture (NA) and an exposure wavelength of a projection optical system. Accordingly, a method for increasing the NA and a method for making the exposure wavelength shorter have been employed to realize high projection resolution. As for the latter method, a g-line light source is replaced by an i-line light source, and further the i-line light source is replaced by an excimer laser. Furthermore, exposure apparatuses using excimer lasers having wavelengths of 248 nm and 193 nm have been put into practical use. Moreover, an EUV (extreme ultraviolet lithography) exposure method using a wavelength of 13 nm has been proposed as a next-generation exposure method.

Various fabrication processes of semiconductor devices have been proposed, and among the various fabrication processes, CMP (chemical mechanical polishing) processing has been attracting considerable attention as a planarization technique for solving a problem of the lack of a focal depth of an exposure apparatus. Furthermore, various configurations and materials of semiconductor devices have been proposed. For example, a P-HEMT (pseudomorphic high electron mobility transistor), an M-HEMT (metamorphic-HEMT) using a combination of chemical compounds such as GaAs and InP, and an HBT (heterojunction bipolar transistor) using SiGe or SiGeC have been proposed.

As described above, since the circuit pattern has been miniaturized, the reticle surface on which the circuit pattern is arranged and the wafer onto which the circuit pattern is projected are required to be aligned with each other with high accuracy. Required accuracy is considered to be one third of a circuit line width. Therefore, for example, in a case where a circuit line width of 90 nm is designed, the required accuracy is considered to be 30 nm, which is one third of 90 nm.

Japanese Patent No. 03347490 discloses an example of a wafer alignment method for the exposure apparatus. In this method, an alignment mark position is detected by template matching using a mark signal obtained by projecting an alignment mark captured using an area sensor, such as a CCD camera, in a longitudinal axis direction and using a mark signal obtained using a line sensor. In the template matching, calculations of the correlations between the mark signal captured using the line sensor and a template stored in a processing apparatus in advance are performed, and the highest correlation position is detected as an alignment mark center. The template matching is represented by the following expression.

Expression (1)

$$E(x) = \sum_{i=-k}^{k} S(x+i)T(i) \quad (1)$$

Here, S denotes the mark signal obtained using the line sensor, T denotes the template, E denotes a result of the correlation calculation processing, x denotes an alignment mark position, and i denotes an alignment mark position in a window set in the correlation calculation processing.

In wafer alignment, a measuring error called a WIS (wafer induced shift) is caused due to processing. Examples of the WIS include asymmetry of a configuration of an alignment mark and asymmetry of a resist form to be applied to a wafer, which are caused by planarization processing such as CMP processing. Such asymmetry of a configuration of an alignment mark and uneven coating of resist cause asymmetry of a mark signal to be obtained using a sensor. The asymmetry of a mark signal further causes generation of a measuring error in wafer alignment employing template matching resulting in deterioration of capability of a semiconductor device and decreasing of fabrication yield of the semiconductor device.

SUMMARY OF THE INVENTION

An aspect of present invention is that it improves an accuracy in detecting a position of a mark from a mark signal.

According to an aspect of the present invention, there is provided an apparatus that detects mark positions from mark signals obtained by imaging a plurality of marks. The apparatus includes a signal processor. The signal processor sets processing windows in a plurality of positions relative to the mark signals, calculates even function intensities in the processing windows in the plurality of positions of the mark signals, and detects positions of the marks in accordance with the calculated even function intensities of the plurality of positions.

Moreover, according to another aspect of the present invention, the apparatus may be an exposure apparatus that exposes a substrate having the marks.

According to another aspect of the present invention, there is provided a method of manufacturing a device. The method includes exposing a substrate to light using the apparatus described above, developing the exposed substrate, and processing the developed substrate to manufacture the device.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Various embodiments, features and aspects of the present invention will be described hereinafter with reference to accompanying drawings.

In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

The embodiments of the present invention disclose exposure apparatuses in which a measurement position error is not generated, even when a mark signal is asymmetry at a time of wafer alignment.

The wafer alignment according to the embodiments is performed such that a temporary center line and a processing window are set for an asymmetry mark signal, symmetrical components (intensities of an even function) in the processing window is extracted by Fourier transform, and a total of intensities of even functions in spatial frequencies is calculated as a symmetry index of a mark. The calculation for obtaining a symmetry index is repeatedly performed while the temporary center line is shifted in a predetermined shift range, whereby a position of the temporary center line which represents a maximum symmetry index is detected as a mark center position. Accordingly, a measuring error caused by an asymmetrical component of the mark signal is prevented from generating. Furthermore, by setting a processing window so as to have a width which represents the maximum intensity of an even function in a spatial frequency unique to a shape of an alignment mark or by setting a processing window which excludes a region which does not include mark information, detection is performed with an improved S/N ratio and with high accuracy. Furthermore, by setting a processing window including the odd number of points and a processing window including the even number of points for a mark signal, and alternately calculating symmetry indexes and synthesizing them, high accuracy detection having double resolution in the measurement direction can be performed. Moreover, in accordance with the odd function intensities of the mark signal, a mark position to be detected at a time of global alignment is weighted whereby a shot arrangement may be calculated with high accuracy.

First Exemplary Embodiment

Figure 1:
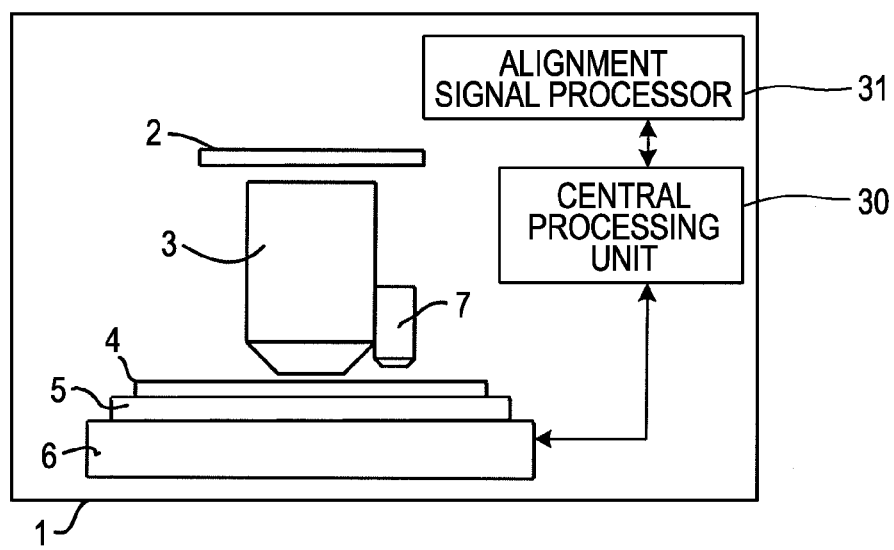
FIG. 1 shows a schematic diagram illustrating an example configuration of a semiconductor exposure apparatus according to a first embodiment of the present invention.
Figure 15:
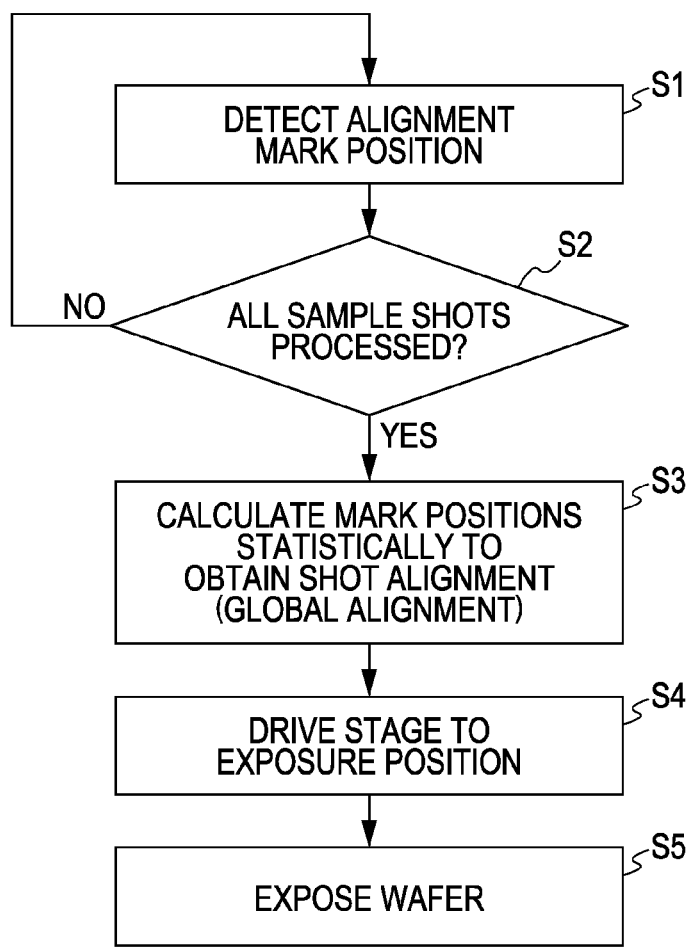
FIG. 15 shows a flowchart illustrating a series of exposure operations according to the first embodiment of the present invention.

An example of an exposure apparatus to which the present invention is applied is described in a first embodiment. FIG. 1 shows a schematic diagram illustrating a semiconductor exposure apparatus according to the first embodiment of the present invention. FIG. 15 shows a flowchart illustrating a series of exposure operations performed using a central processing unit 30 shown in FIG. 1.

An exposure apparatus 1 includes a reduction projection optical system 3 which projects a reticle 2 on which a certain circuit pattern is arranged while reducing the projection size of the reticle 2, and a wafer chuck 5 which holds a wafer 4 on which a ground pattern and an alignment mark were formed in a front-end process. The exposure apparatus 1 further includes a wafer stage 6 used for positioning of the wafer 4 in a predetermined position, and an alignment detection optical system 7 which is used to measure a position of an alignment mark 11 (shown in FIG. 2) on the wafer 4.

Figure 2:
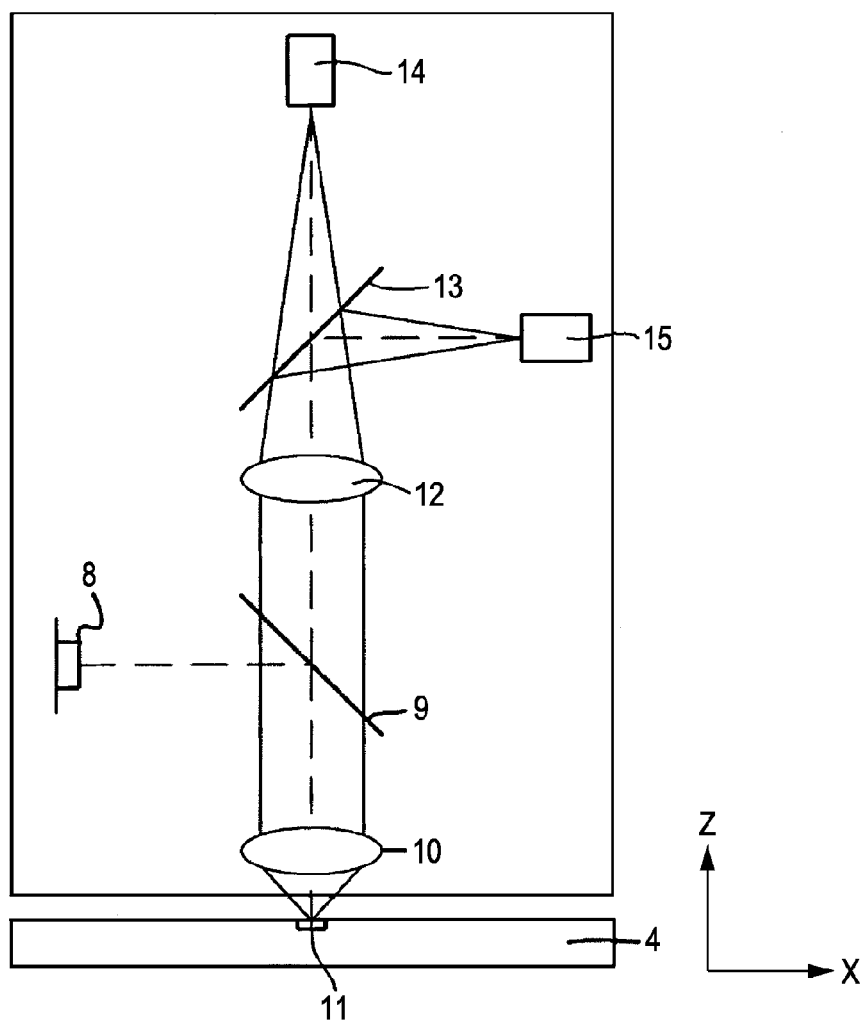
FIG. 2 shows a diagram illustrating an example position detection optical system which is applicable to the semiconductor exposure apparatus of FIG. 1.

Referring to FIG. 15, step S1 where a position of the alignment mark 11 arranged on the wafer 4 is detected will now be described. FIG. 2 shows components of the alignment detection optical system 7. Light emitted from a light source 8 is reflected by a beam splitter 9, passes through a lens 10, and illuminates the alignment mark 11 arranged on the wafer 4 to become diffracted light. The diffracted light from the alignment mark 11 passes through the lens 10, the beam splitter 9, and a lens 12, and is divided by a beam splitter 13. Then, divided pieces of light are made incident to CCD sensors 14 and 15. Here, the alignment mark 11 is enlarged by the lenses 10 and 12 by a certain magnification which realizes resolution which satisfies desired measurement accuracy, and is imaged by the CCD sensors 14 and 15. The CCD sensors 14 and 15 are used for measuring deviation of the alignment mark 11 in the X direction and used for measuring deviation of the alignment mark 11 in the Y direction, respectively, and are arranged so as to have such a relationship that the CCD sensor 15 is in a position in which the CCD sensor 14 is rotated by 90° with respect to an optical axis. Measurement principles in the X direction and the Y direction are the same, and therefore, only position measurement in the X direction will be described hereinafter.

Figure 3A:
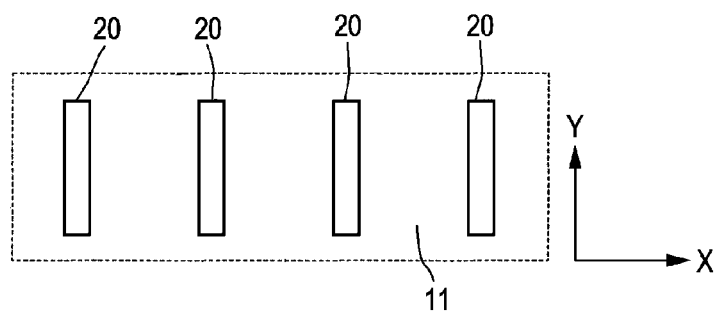
FIG. 3A shows a plan view of an example of a configuration of a mark used for position detection which is performed using the semiconductor exposure apparatus of FIG. 1.
Figure 3B:
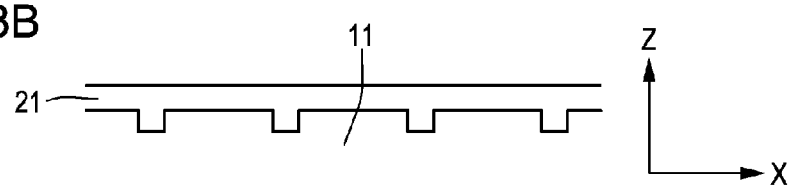
FIG. 3B shows a sectional view of an example of a configuration of a mark used for position detection which is performed using the semiconductor exposure apparatus of FIG. 1.

An example of the alignment mark 11 used for position measurement will now be described. As shown in FIG. 3A, a plurality of rectangular alignment marks 20, each of which has predetermined lengths in a measurement direction (in the X direction) and in a non-measurement direction (in the Y direction), are arranged in the X direction with predetermined intervals therebetween. As shown in FIG. 3B, in a sectional configuration, the alignment mark 11 has recesses formed by etching processing and a resist 21 is applied to a top surface of the alignment mark 11.

Figure 4:
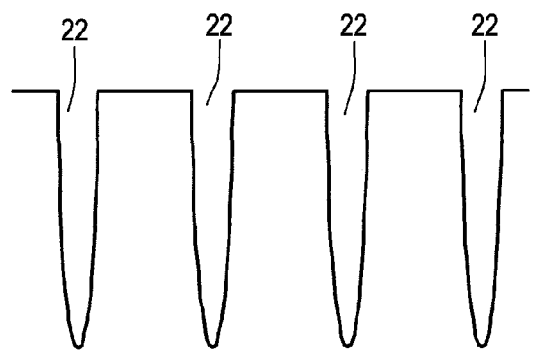
FIG. 4 shows an example of a mark signal obtained from the mark shown in FIGS. 3A and 3B.

FIG. 4 shows an example of mark signals obtained when illumination light is irradiated to the plurality of rectangular alignment marks 20 and reflection light thereof is received by the CCD sensor 14. In step S1, mark signals 22 shown in FIG. 4 are subjected to signal processing to detect centers of marks, and an average of the detected centers of the marks is detected as a final alignment mark position.

The signal processing of this embodiment will be described hereinafter by taking a certain mark signal as an example with reference to the flowchart shown in FIG. 17.

Figure 5:
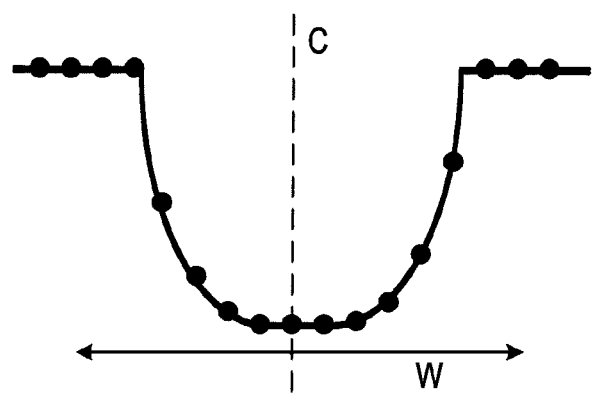
FIG. 5 shows a graph illustrating signal processing according to the first embodiment of the present invention.

In step S100, the central processing unit 30 inputs a mark signal shown in FIG. 5 to an alignment signal processor 31 shown in FIG. 1. In step S101, the central processing unit 30 sets a "temporary mark center C" (hereinafter referred to as a "temporary center C") and a "processing window W having a temporary center C as a center" (hereinafter referred to as a "window W") for the input mark signal. In step S102, even function components at the temporary center C in the window W are extracted by Fourier transform.

Figure 6:
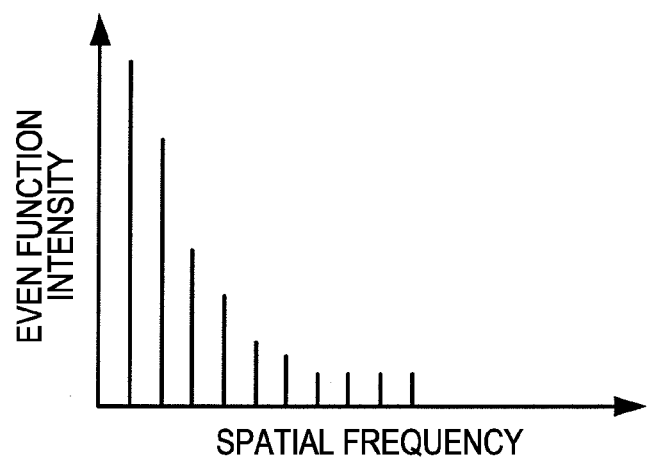
FIG. 6 shows a graph illustrating the signal processing according to the first embodiment of the present invention and illustrating the relationship between spatial frequencies and intensities of an even function.

The even function components extracted in step S102 are shown in FIG. 6. In FIG. 6, an abscissa axis denotes a "spatial frequency f of the mark signal" (hereinafter referred to as "spatial frequencies") and an ordinate axis denotes "intensity of even function e(f)" (hereinafter referred to as "even function intensities"). The even function intensities of FIG. 6 represent symmetrical components when the temporary center C is set as a center, and therefore, the even function intensities are not influenced by asymmetrical components of the mark signal. That is, the even function intensities can be used for detection of a mark center as symmetry indexes which are not influenced by asymmetrical components. In this embodiment, in step S103, a total E of the even function intensities in the corresponding spatial frequencies is extracted and is set as a symmetry index for detection of a mark center. Note that processing in step S103 is represented by the following expression (2), where N denotes the number of sample points in the window W.

Expression (2)

$$E = \sum_{f=0}^{N/2} (e(f)) \quad (2)$$

Figure 7:
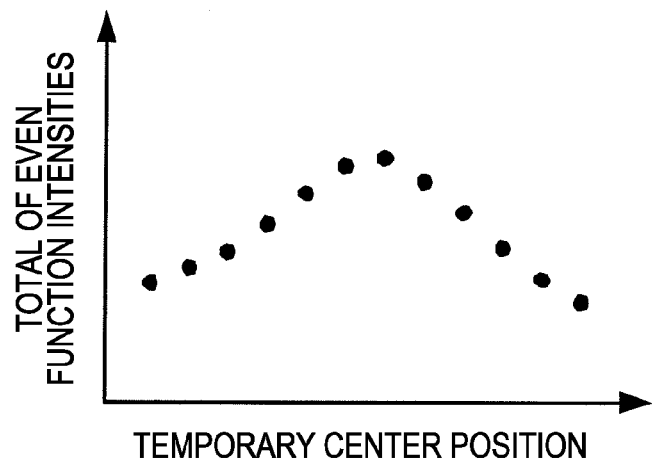
FIG. 7 shows a graph illustrating the signal processing according to the first embodiment of the present invention and illustrating an evaluation waveform.

After the calculation of the symmetry index, in step S104, the temporary center C is shifted in the measurement direction (in the X direction). Steps S101 to S104 are repeatedly performed until the predetermined shift range is totally processed. When it is determined that the predetermined shift range has been totally processed in step S105, the process proceeds to step S106 where a discrete curve E(X) (hereinafter referred to as an "evaluation waveform") shown in FIG. 7 is calculated. A peak position Xpeak of the evaluation waveform E(X) denotes a position of the maximum symmetrical component of the mark signal, and accordingly represents a mark center.

Then, in step S107, a center of gravity of the evaluation waveform E(X) is calculated (hereinafter referred to as "gravity center calculation") whereby the peak position Xpeak of the evaluation waveform E(X) is detected with accuracy of a subpixel level. The signal processing in this embodiment is thus terminated.

In step S2 of FIG. 15, when it is determined that all alignment marks in predetermined sample shots in the wafer have been subjected to the signal processing performed in step S1 to detect positions of the alignment marks, the process proceeds to step S3 where results of the detections of the alignment mark positions are statistically processed and global alignment processing is performed for calculating alignment of all sample shots on the surface of the wafer. In accordance with a correction amount of the alignment of shots obtained by performing the global alignment processing, the wafer stage 6 is driven in step S4, and the wafer 4 is exposed in step S5. A series of exposure operations is terminated.

Figure 17:
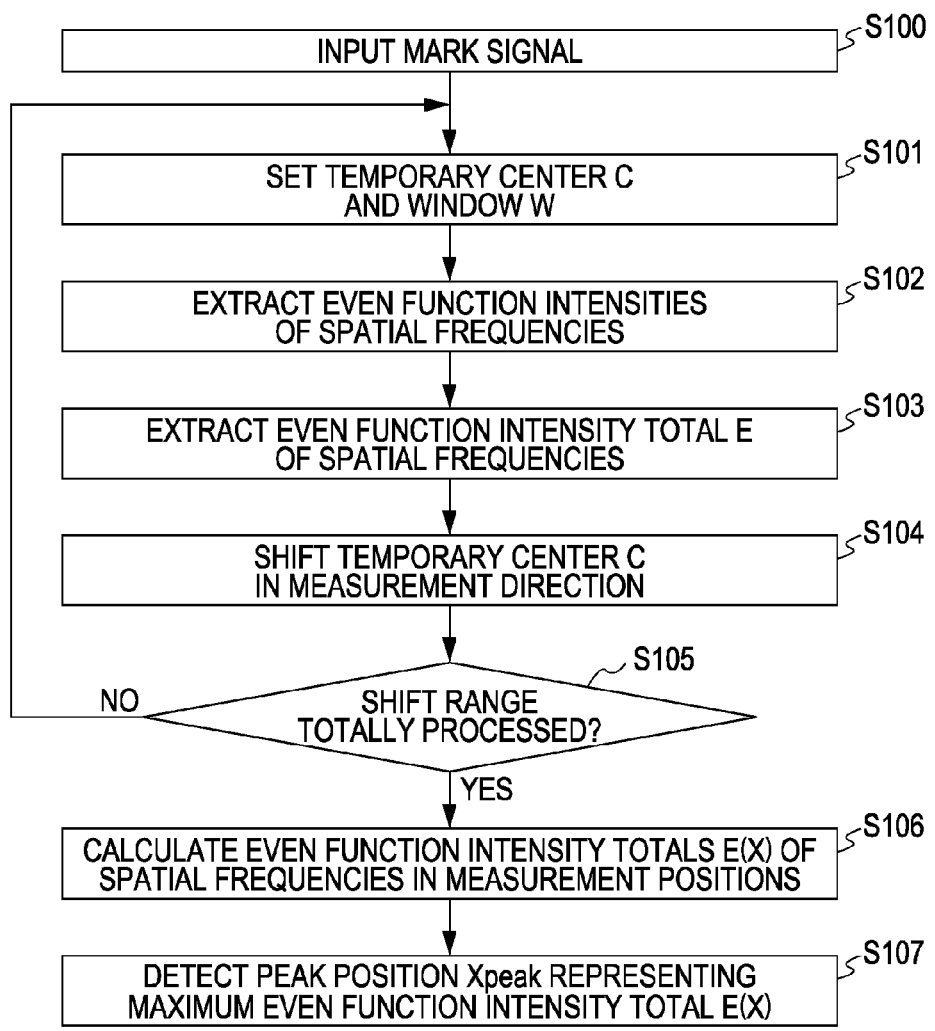
FIG. 17 shows a flowchart illustrating the signal processing according to the first embodiment of the present invention.
Figure 18:
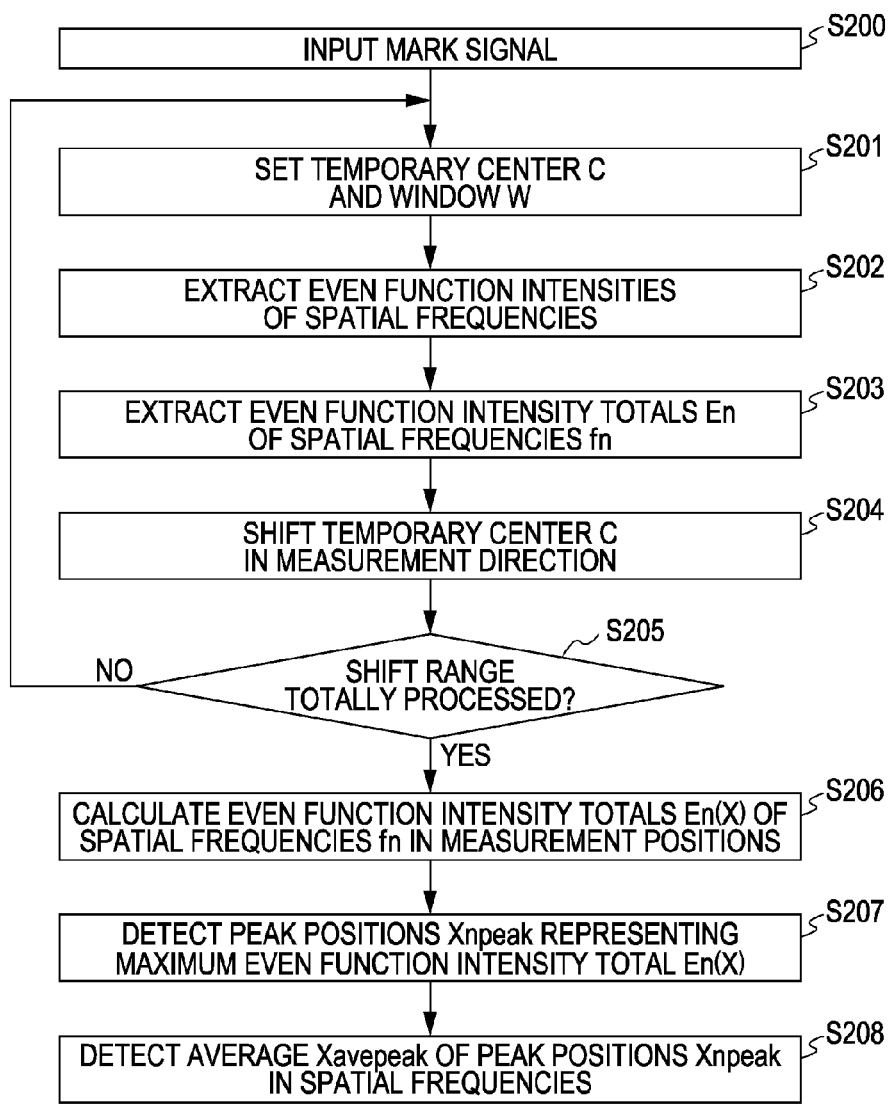
FIG. 18 shows a flowchart illustrating a modification of the signal processing according to the first embodiment of the present invention.

Note that as with the signal processing of this embodiment illustrated by the flowchart shown in FIG. 17, signal processing illustrated by the flowchart shown in FIG. 18 may be employed in which a plurality of mark centers are obtained by calculating a plurality of symmetry indexes, and an average of the plurality of mark centers is set as a final mark center. A modification of the signal processing will be described hereinafter with reference to the flowchart shown in FIG. 18. Steps S200 to S202 shown in FIG. 18 are the same as steps S100 to S102 shown in FIG. 17. The total E of the even function intensities in all the spatial frequencies is calculated in step S103, whereas a total En (n=1, 2, . . . , n) of the number n of even function intensities in the number n of spatial frequencies is calculated in step S203. Note that step S203 is represented by the following expression (3)

Expression (3)

$$E_1 = \sum_{f=a1}^{b1} (e(f_1)), \quad (3)$$

$$E_2 = \sum_{f=a2}^{b2} (e(f_2)), \ldots E_n = \sum_{f=an}^{bn} (e(f_n))$$

Step S204 is the same as step S104. Steps S201 to S204 are repeated until the predetermined shift range is totally processed. When it is determined that the predetermined shift range have been totally processed in step S205, the process proceeds to step S206 where the number n of evaluation waveforms En(X) are obtained. Then, as with step S106, gravity center calculation is performed so that the number n of peak positions Xnpeak are detected with accuracy of a subpixel level. Then, in step S207, an average Xavepeak of the peak positions Xnpeak is detected as a final mark center, and the signal processing is terminated.

A shape of the alignment mark 11 of this embodiment is not limited to that shown in FIG. 3B. The processing for extracting the intensities of the even function performed in steps S102 and S202 is not limited to Fourier transform, but any other orthogonal transform may be used. The processing for obtaining the symmetry index performed in steps S103 and S203 is not limited to the processing utilizing a "total of even function intensities", but processing utilizing a "total of weighted even function intensities", an "average of even function intensities", or a "root-mean-square of even function intensities" may be used. The processing for detecting the peak position of the evaluation waveform with accuracy of a subpixel level performed in steps S107 and S207 is not limited to the gravity center calculation, but a polynomial approximation method may be used. The processing for obtaining the total En of the number n of the even function intensities performed in step S203 is not limited to processing of selecting the number n of spatial frequencies. That is, "processing of selecting a specific spatial frequency region (in this case, n=1)", and "processing of selecting a specific spatial frequency region and a higher frequency region thereof" may be used. Furthermore, "processing of selecting a spatial frequency region which does not include low frequency components" may be used making use of an advantage in which uneven coating of the resist can be prevented and an effect of the CMP processing is marked at low frequencies.

Second Exemplary Embodiment

An example of an exposure apparatus in which processing of setting a width of a processing window so that an S/N ratio of a symmetry index is improved is employed is described in a second embodiment. A configuration and an operation of the exposure apparatus in the second embodiment are the same as those of the exposure apparatus in the first embodiment except for the signal processing performed in step S1 in FIG. 15. Accordingly, only signal processing in the second embodiment will be described with reference to a flowchart shown in FIG. 19.

Figure 8:
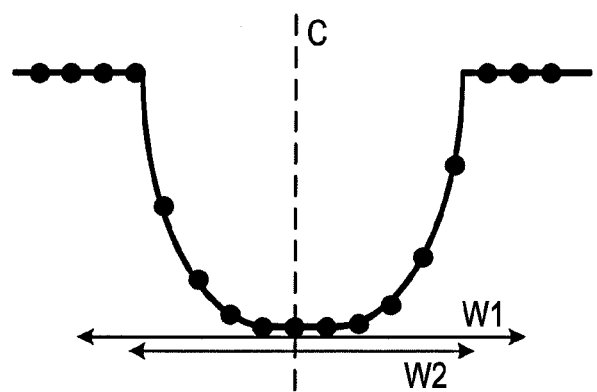
FIG. 8 shows a graph illustrating signal processing according to a second embodiment of the present invention.
Figure 9:
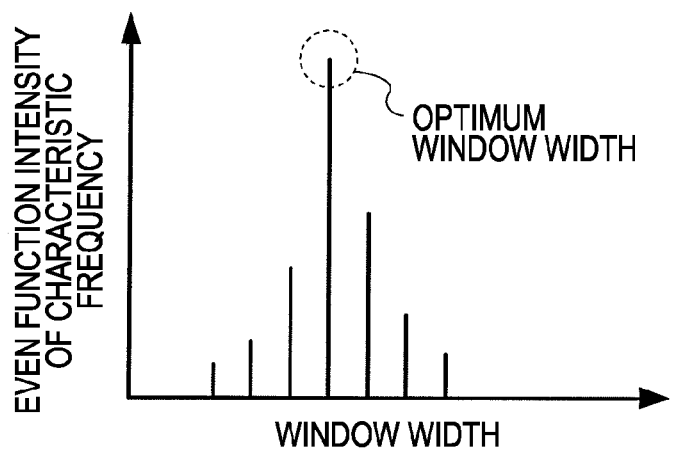
FIG. 9 shows a graph illustrating the signal processing according to the second embodiment of the present invention.

In step S300, a mark signal shown in FIG. 8 is input into the alignment signal processor shown in FIG. 1. The process proceeds to step S301 where a "temporary center C" and a "temporary processing window W1 having the temporary center C as a center" (hereinafter referred to as a "temporary window W1") are set for the input mark signal. Then, in step S302, even function intensities of "spatial frequencies unique to shapes of alignment marks" (hereinafter referred to as "characteristic frequencies") in the temporary center C included in the temporary window W1 are extracted by Fourier transform. In step S302-0, a width of the temporary window W1 is changed, and the processes from steps S300 to S302-0 are repeatedly performed until a predetermined change range is totally processed. By this, the relationship between even function intensities of characteristic frequencies and a width of the window shown in FIG. 9 is calculated. Then, the process proceeds to step S302-2 where "an optimum processing window W2 which represents the maximum even function intensity of a characteristic frequency" (hereinafter referred to "optimum window W2") is detected. After the optimum window W2 is detected in step S302-2, it is determined whether the optimum window W2 is equal to the temporary window W1 in step S302-3. When the determination is negative, the temporary center C and the optimum window W2 are set in step S302-4, and the process proceeds to step S302-5 where even function intensities at the temporary center C in the optimum window W2 are extracted by Fourier transform. In this signal processing, steps S303 to S307 after step S302-5 are the same as steps S103 to S107. In this embodiment, since the optimum window W2 is used, the S/N ratio of the symmetry index is improved when compared with the use of the temporary window W1, and accordingly, detection of a mark center is performed with high accuracy.

Figure 10:
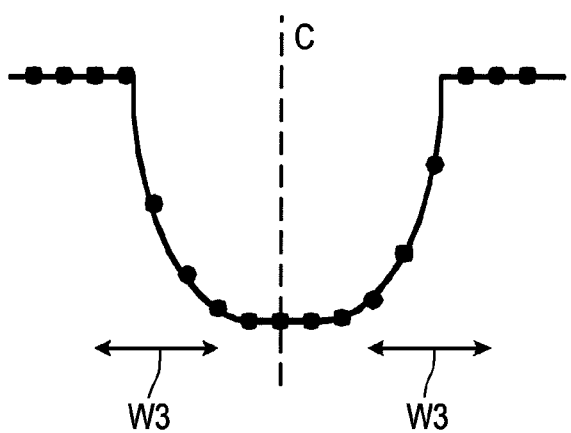
FIG. 10 shows a graph illustrating the signal processing according to the second embodiment of the present invention.
Figure 19:
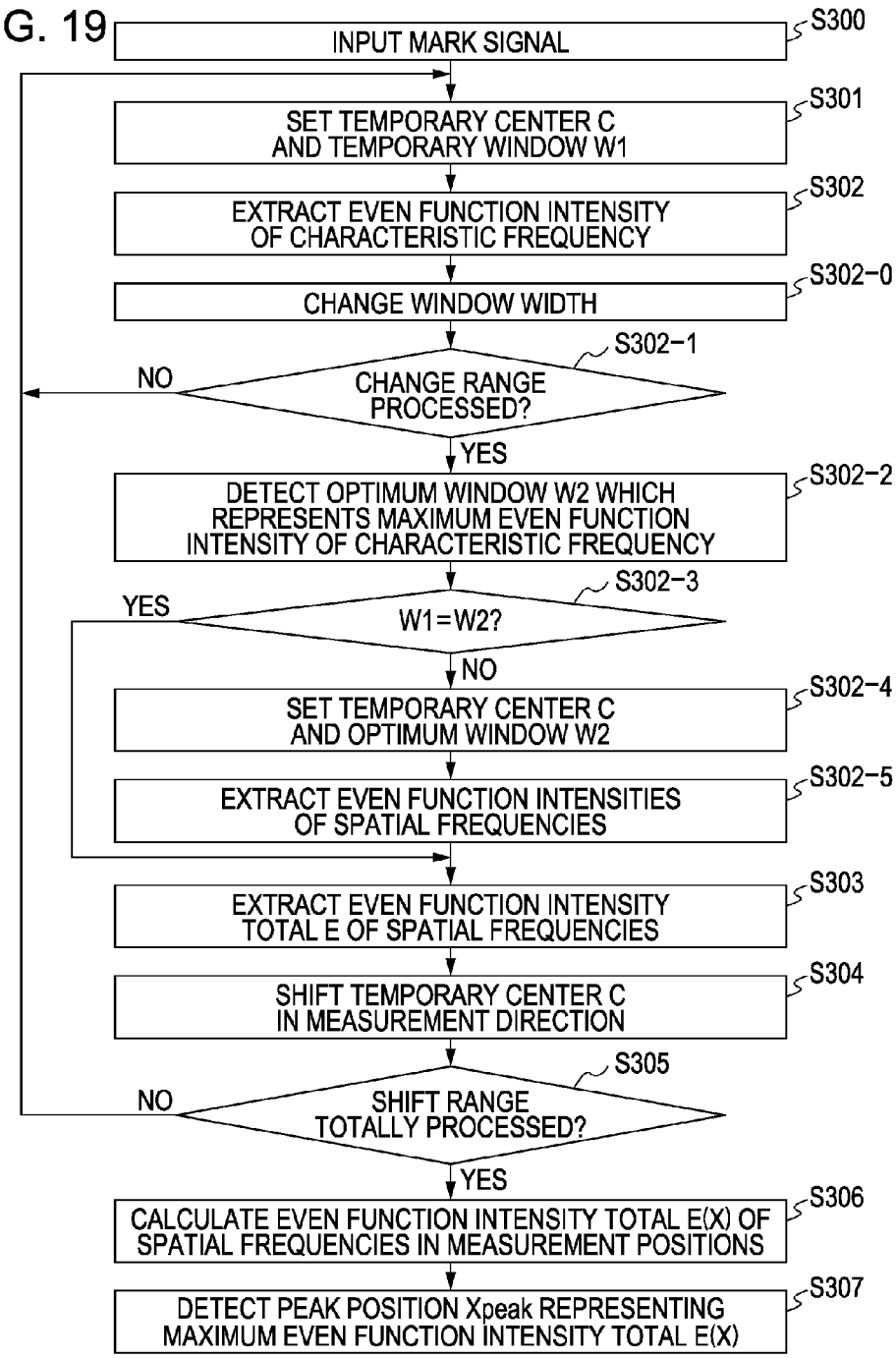
FIG. 19 shows a flowchart illustrating the signal processing according to the second embodiment of the present invention.

As a modification of the signal processing described in FIG. 19, in step S301, a "temporary center C" and a "processing window W3 which excludes the temporary center C and points in the vicinity thereof" (hereinafter referred to as a "window W3") may be set for the mark signal as shown in FIG. 10. In this case, since the window W3 is set for the mark signal, influence from noise generated in a region which does not include mark information can be avoided. In addition, a mark center can be detected with a high S/N ratio and with high accuracy when compared with the case where the points in the vicinity of the temporary center C are not eliminated. Note that the processing of setting the window W3 is applicable not only to the processing illustrated in step S301 in the second embodiment, but also to steps S101 and S201 in the first embodiment. Furthermore, a shape of the window of the processing in step S301 is not limited to the shape of the window W3. Moreover, a method used in the processing of extracting the even function intensities in steps S302 and S302-4 is not limited to Fourier transform but any other orthogonal transform may be used.

Third Exemplary Embodiment

Figure 20:
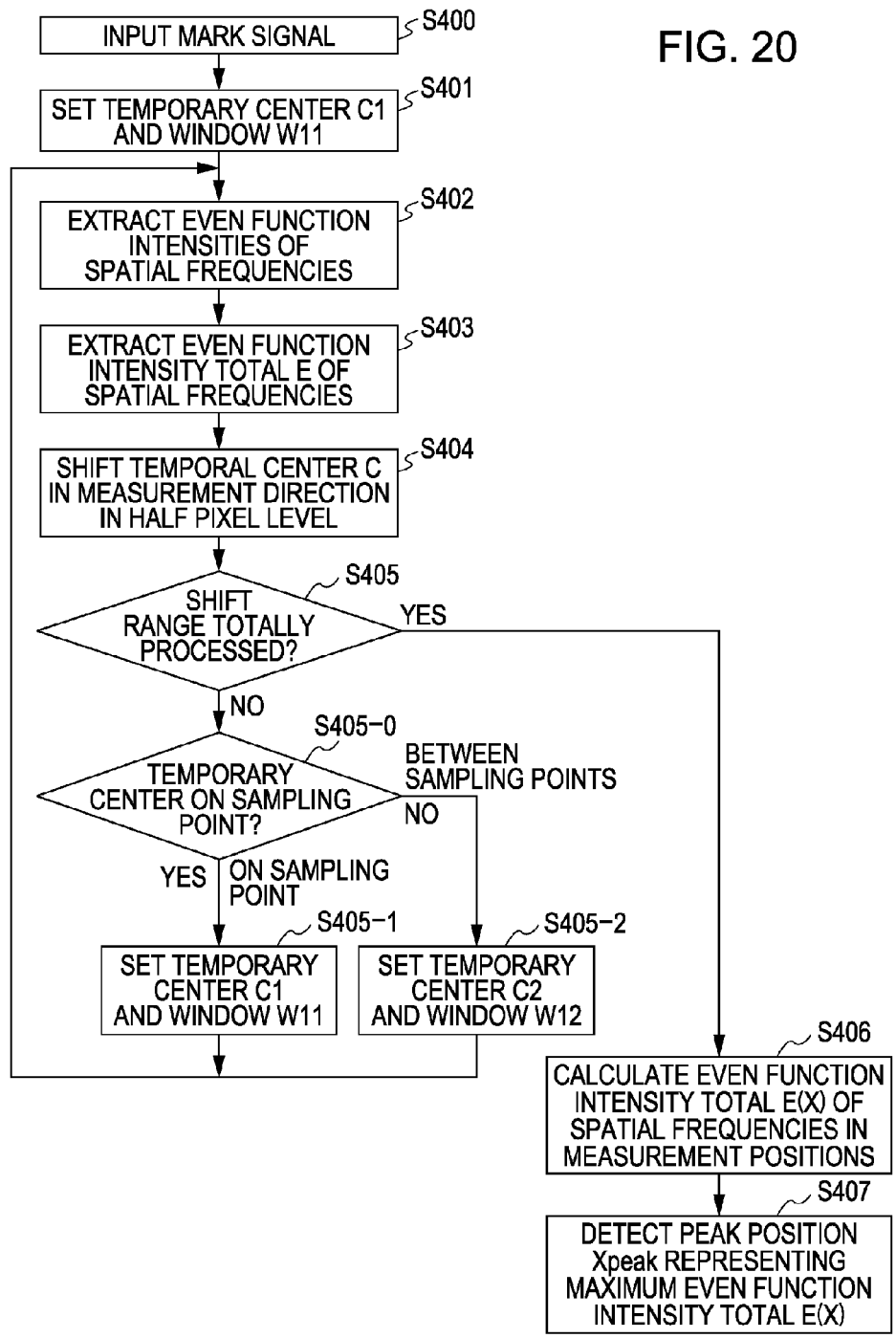
FIG. 20 shows a flowchart illustrating the signal processing according to the third embodiment of the present invention.

An example of an exposure apparatus in which processing of realizing a double resolution in the measurement direction (in the X direction) by setting a processing window including an odd number of "points" (hereinafter referred to as "sample points" and a processing window including an even number of sample points, and by alternately calculating symmetry indexes and synthesizing them is employed is described in a third embodiment. A configuration and an operation of the exposure apparatus in the third embodiment are the same as those of the exposure apparatus in the first embodiment except for the signal processing performed in step S1 in the first embodiment. Therefore, only signal processing in the third embodiment will be described with reference to a flowchart in FIG. 20.

Figure 11:
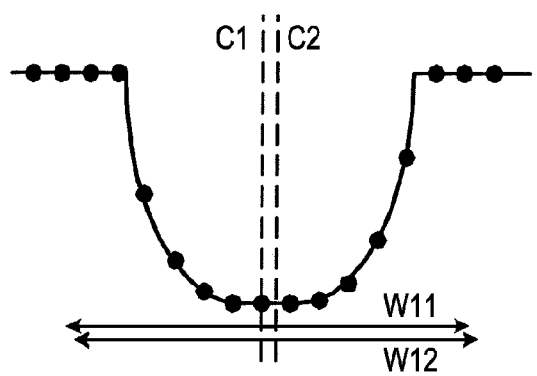
FIG. 11 shows a graph illustrating a modification of the signal processing as a third embodiment of the present invention.
Figure 13:
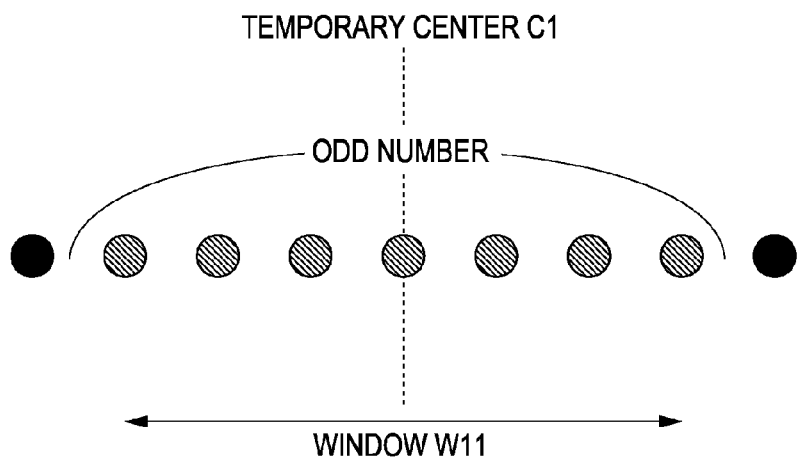
FIG. 13 shows a diagram illustrating the signal processing according to the third embodiment of the present invention.
Figure 14:
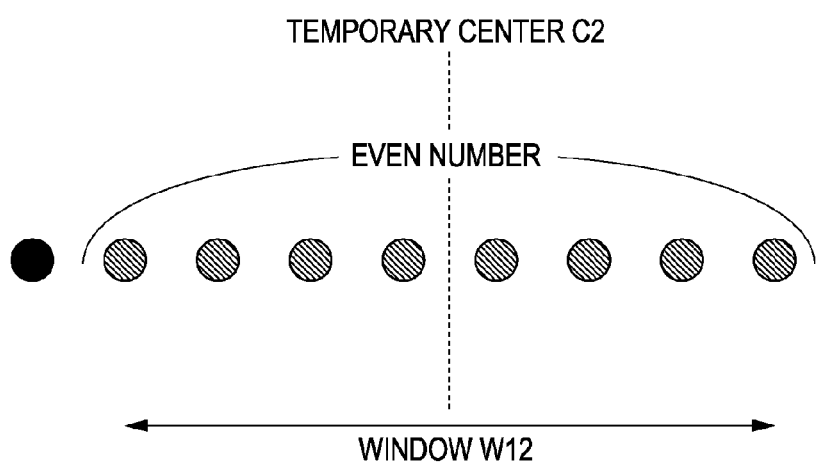
FIG. 14 shows a diagram illustrating the signal processing according to the third embodiment of the present invention.

In step S400, a mark signal shown in FIG. 11 is input to the alignment signal processor shown in FIG. 1. Then, the process proceeds to step S401 where a "temporary center C1 on a sample point" and a "processing window W11 having the temporary center C1 on the sample point as a center" (hereinafter referred to as a "window W11") are set. Note that a width of the window W11 is set so as to include the odd number of sample points as shown in FIG. 13. Steps S402 and S403 are similar to steps S102 and S103. In step S404, the temporary center C1 is shifted in the measurement direction (in the X direction) by "half an interval between sample points" (hereinafter referred to as a "half pixel"). The temporary center shifted by a half pixel and therefore positioned between the sample points is set as a "temporary center C2 between the sample points", and a "processing window W12 having the temporary center C2 between the sample points as a center" (hereinafter referred to as a "window W12") is set. Note that a width of the window W12 is set so as to include the even number of sample points as shown in FIG. 14.

Figure 12:
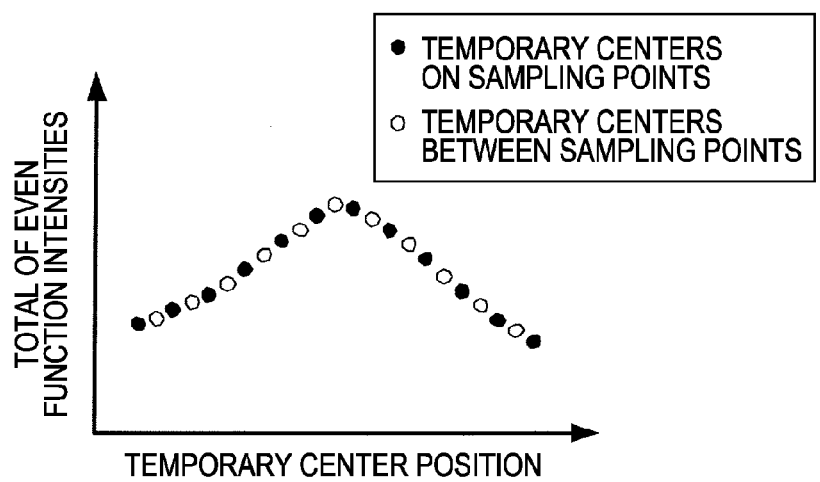
FIG. 12 shows a graph illustrating the signal processing according to the third embodiment of the present invention.

Steps S402 to S405-2 are repeatedly performed until a predetermined shift range is totally processed while the processing window set in accordance with a position of the temporary center is alternately changed between the window W11 (step S405-1) and the window W12 (step S405-2). After the predetermined shift range has been totally processed, an evaluation waveform as shown in FIG. 12 is calculated in step S406. Step S407 where a mark center is detected is the same as step S107. Since a double resolution in the measurement direction (in the X direction) of the evaluation waveform is realized according to the signal processing of this embodiment, a mark center is detected with high accuracy.

Note that the processing from step S404 to step S405-2 where a double resolution of an evaluation waveform in a measurement direction (in the X direction) is realized by shifting the temporary center in the measurement direction (in the X direction) by a half pixel is easily applicable to the processing of steps S104 and S105 in the first embodiment, to the processing of steps S204 and S205 in the first embodiment, and to the processing of steps S304 and S305 in the second embodiment.

Fourth Exemplary Embodiment

An example of an exposure apparatus in which processing of calculating a shot arrangement with high accuracy by weighting, using odd function intensities of a mark signal, a mark position detected at a time of global alignment is employed is described in a fourth embodiment. A configuration and an operation of an exposure apparatus according to the fourth embodiment is the same as those of the exposure apparatus according to the first embodiment except for the signal processing performed in step S1 and the global alignment processing performed in step S3 in the first embodiment. Therefore, signal processing and global alignment processing in this embodiment will be described with reference to flowcharts shown in FIGS. 16 and 21.

Figure 16:
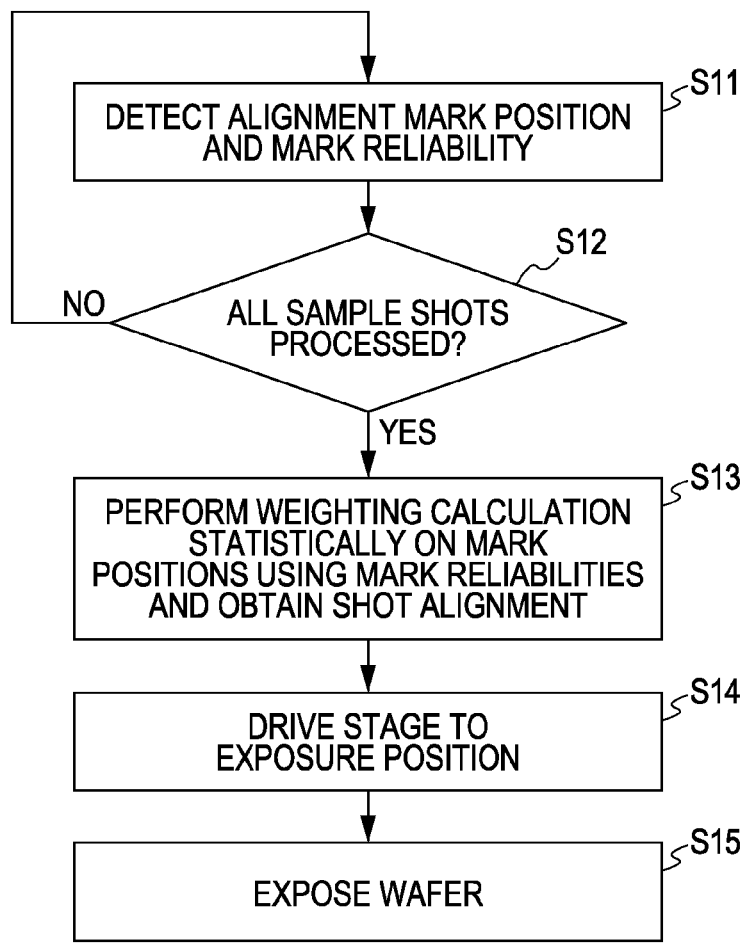
FIG. 16 shows a flowchart illustrating a series of exposure operations according to a fourth embodiment of the present invention.
Figure 21:
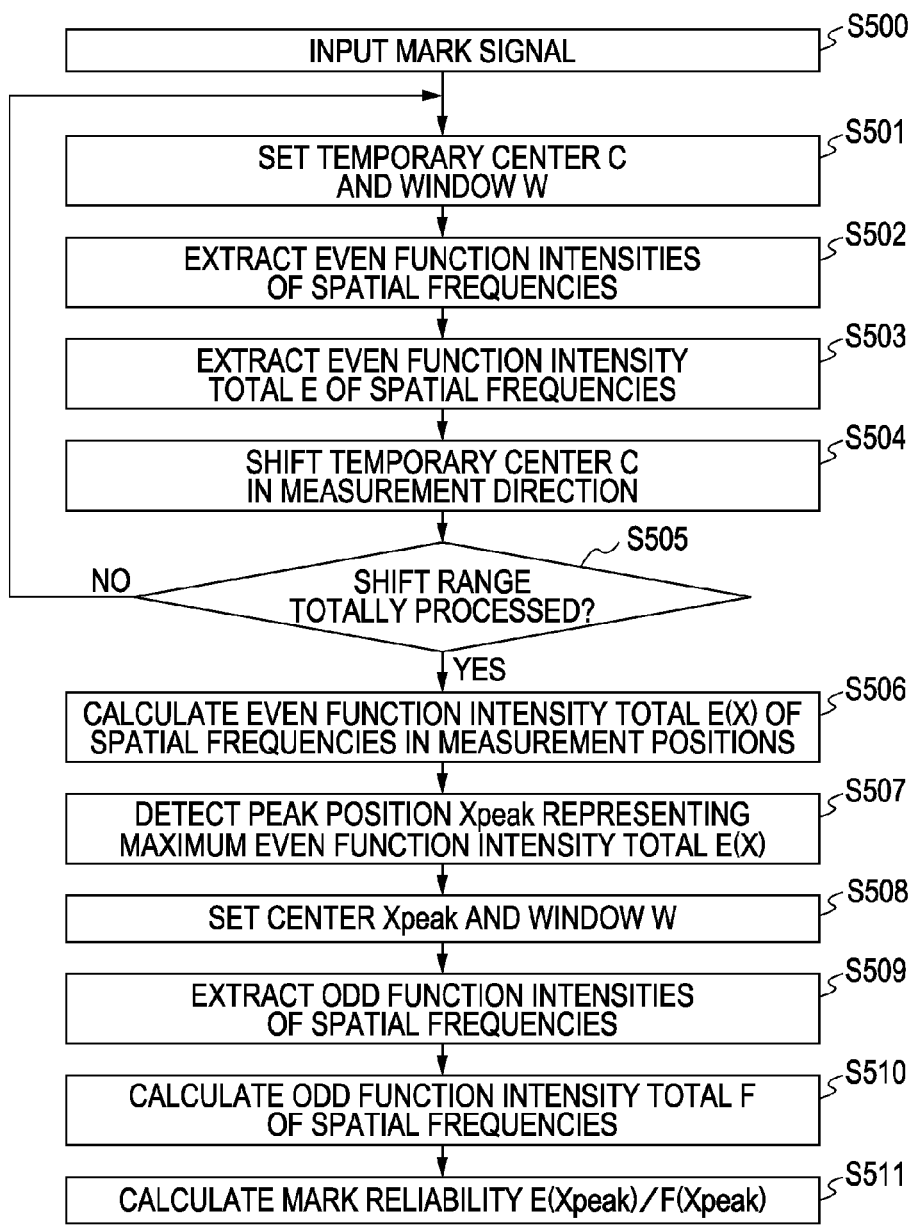
FIG. 21 shows a flowchart illustrating the signal processing according to the fourth embodiment of the present invention.

In the signal processing performed in step S11 shown in FIG. 16 represented by steps S500 to S511 shown in FIG. 21, processing from step S500 where a mark signal is input to step S507 where a mark center is detected is the same as the processing from steps S100 to S107 shown in FIG. 17 representing step S1 shown in FIG. 15. In this embodiment, after the mark center is detected in step S507, the process proceeds to step S508 where a center Xpeak and a window W are set. Then, in step S509, odd function intensities at the center Xpeak in the window W are extracted by Fourier transform. The odd function intensities of the mark signal represent asymmetrical components provided that the center Xpeak is set as a center. Accordingly, a "total F(Xpeak) of odd function intensities of spatial frequencies" is calculated in step S510 whereby an index representing an amount of asymmetry of the mark signal can be obtained. Then, in step S511, a "ratio of the total E(Xpeak) of the even function intensities to the total F(Xpeak) of the odd function intensities", which is represented by E(Xpeak)/F(Xpeak), is calculated whereby a "reliability of the mark signal" (hereinafter referred to as a "mark signal reliability") is obtained to be used hereafter. The mark reliability is used in the global alignment processing performed in step S13 as a weight in weighting processing for the detected mark position. Since the weighting processing is performed on the detected mark position in accordance with the mark reliability at the time of the global alignment processing, a shot arrangement is calculated with high accuracy. The detailed description thereof is disclosed in Japanese Patent Laid-Open No. 2-294015, and therefore, is omitted herein.

Note that the processing from step S501 to step S507 is replaceable by the processing from step S101 to step S107 in the first embodiment, the processing from step S201 to step S208 in the first embodiment, the processing from step S301 to step S307 in the second embodiment, and the processing from step S401 to step S407 in the third embodiment with ease. Furthermore, a method used in the processing of extracting the odd function intensities performed in step S509 is not limited to Fourier transform, and any other orthogonal transform may be used. Moreover, the calculation used in the processing of calculating the mark reliability performed in step S511 is not limited to the calculation of E(Xpeak)/F(Xpeak).

Application of the Invention

The signal processing in each of the above-described embodiments is performed in the bright-field illumination. Accordingly, the signal processing is applicable not only alignment measurement processing of an exposure apparatus but also other processing. For example, each of the embodiments may be applicable to alignment processing of substrates of a superposition inspection device or of a high-accuracy measurement device, such as a CD-SEM (Critical Dimension-Scanning Electron Microscope) or an AFM (Atomic Force Microscope).

According to each of the embodiments in which the present invention is employed in the exposure apparatus for detecting an alignment mark position, occurrence of a detection error due to a WIS is reduced, and therefore, accuracy of alignment and fabrication yield of a semiconductor device are improved. The present invention is also applicable to alignment processing of substrates of a superposition inspection device or of a high-accuracy measurement device such as a CD-SEM or an AFM. Here, in a case where a mark position is detected from a mark signal, even when a defect and asymmetry of a configuration of a mark and uneven coating of a resist cause a WIS, the mark position is detected with high accuracy.

Fifth Exemplary Embodiment

Fabrication processing of a microdevice (for example, a semiconductor chip such as an IC (integrated circuit) or an LSI (large scale integration), a liquid crystal panel, a CCD sensor, a thin film magnetic head, and a micromachine) utilizing the exposure apparatus described above will now be described.

Figure 22:
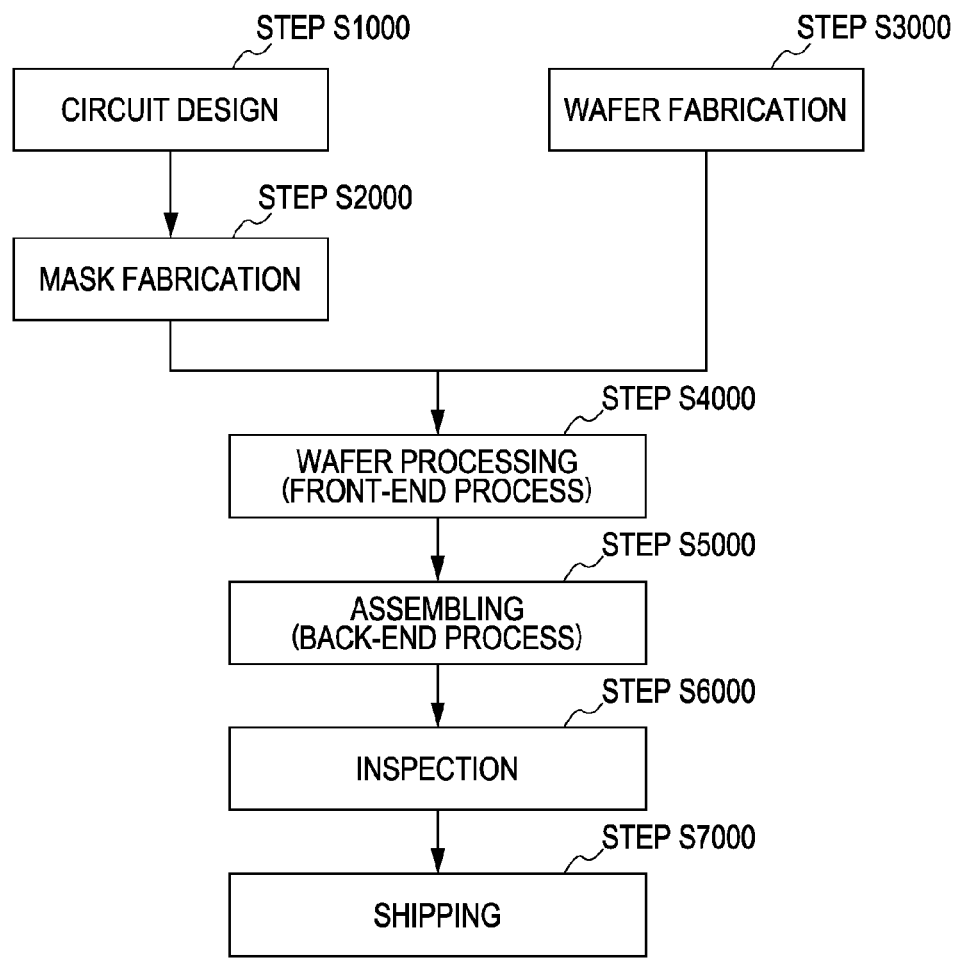
FIG. 22 shows a flowchart illustrating device fabrication processing.

FIG. 22 shows a flowchart illustrating device fabrication processing. In step S1000 (circuit design), a circuit of a semiconductor device is designed. In step S2000 (mask fabrication), a mask (that is, an original or a reticle) in which a designed pattern is formed thereon is fabricated.

Meanwhile, in step S3000 (wafer fabrication), a wafer (that is, a substrate) is fabricated using a material such as a silicon. In step S4000 (wafer processing) which is called a front-end process, an actual circuit is formed on the wafer by a lithography technique using the wafer and an exposure apparatus in which the fabricated mask is arranged thereon.

In step S5000 (assembling) which is called a back-end process, a semiconductor chip is generated using the wafer which is fabricated in step S4000. The back-end process includes an assembling process (dicing, or bonding), and a packaging process (chip inclusion). In step S6000 (inspection), an inspection process such as an operation confirmation test and a durability test is performed on the semiconductor device fabricated in step S5000. The semiconductor device is completed through the processes described above, and is shipped in step S7000.

The wafer processing performed in step S4000 includes a oxidation step in which a surface of a wafer is oxidized, a CVD (chemical vapor deposition) step in which a insulating film is formed on the surface of the wafer, and a electrode forming step in which an electrode is formed on the wafer by vapor deposition. The wafer processing performed in step S4000 further includes an ion injection step of injecting ions into the wafer, a resist processing step of applying a photosensitizing agent to the wafer, and an exposure step in which the wafer which has been subjected to the resist processing is exposed through the mask having the circuit pattern. The wafer processing performed in step S4000 further includes a development step in which the wafer which has been subjected to exposure in the exposure step is developed, an etching step in which portions except for a resist image developed in the development step are removed, and a resist removing step in which the resist which is no longer necessary after the etching step is removed. Since the steps described above are repeatedly performed, multiple circuit patterns are formed on the wafer.

According to the embodiments described above, accuracy of detection of a mark position from a mark signal is improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2006-245387, entitled "Mark Position Detection Apparatus" and filed on Sep. 11, 2006, the entire contents of which are incorporated herein by reference.

What is claimed is:

1. An apparatus for detecting a position of a mark from a mark signal obtained by capturing an image of the mark, the apparatus comprising:
a signal processor;
wherein the signal processor is configured to set a plurality of processing windows having centers respectively at a plurality of positions in a detection direction relative to the mark signal, to perform an orthogonal transform, of which orthogonal functions include an even function that is symmetrical with the center, of the mark signal in each of the plurality of processing windows to obtain an intensity of the even function with respect to each of the plurality of positions without based on an odd function, as one of the orthogonal functions, that is asymmetrical with the center, and to obtain, as the position of the mark, a position of the processing window where an intensity of the even function has a peak value, based on the obtained intensity with respect to each of the plurality of positions.

2. An apparatus according to claim 1, wherein the signal processor is configured to determine a width of the processing window based on an intensity of the even function previously obtained with respect to each of a plurality of the width.

3. An apparatus according to claim 1, wherein the signal processor is configured to alternatively set a first processing window including an odd number of sample points and a second processing window including an even number of sample points as the processing window.

4. An apparatus according to claim 1, wherein the signal processor is configured to set a second processing window having a center at the detected positions, to perform an orthogonal transform, of which orthogonal functions include an odd function that is asymmetrical with the center, of the mark signal in the second processing window to obtain an intensity of the odd function, and to obtain a reliability of the detected position based on the obtained intensity of the odd function.

5. An apparatus according to claim 4, wherein the signal processor is configured to calculate a ratio of the intensity of the even function to the intensity of the odd function at the detected position as the reliability.

6. An apparatus according to claim 1, wherein the apparatus is an exposure apparatus that exposes a substrate having the mark to light.

7. An apparatus according to claim 6, wherein
the substrate has an alignment mark in which a plurality of the mark are arranged, and
the signal processor is configured to calculate an average of a plurality of positions respectively detected with respect to the plurality of the marks included in the alignment mark, and to determine the average as a position of the alignment mark.

8. An apparatus according to claim 1, wherein the signal processor is configured to obtain, with respect to each of a plurality of spatial frequencies of the even function, a position of the processing window of which an intensity of the even function has a peak value based on the obtained intensity with respect to each of the plurality of positions which respect to the plurality of spatial frequencies, and to average the obtained positions to detect the position of the mark as the averaged position.

9. A method of manufacturing a device using an apparatus for detecting a position of a mark from a mark signal obtained by capturing an image of the mark, the apparatus including a signal processor, wherein the signal processor is configured to set a plurality of processing windows, having centers respectively at a plurality of positions in a detection direction relative to the mark signal, to perform an orthogonal transform, of which orthogonal functions include an even function that is symmetrical with the center, of the mark signal in each of the plurality of processing windows to obtain an intensity of the even function with respect to each of the plurality of positions without based on an odd function, as one of the orthogonal functions, that is asymmetrical with the center, and to obtain, as the position of the mark, a position of the processing window of which an intensity of the even function has a peak value, based on the obtained intensity with respect to each of the plurality of positions, and wherein the apparatus is an exposure apparatus for exposing a substrate having the mark to light,
the method comprising:
exposing a substrate to light using the apparatus;
developing the exposed substrate; and
processing the developed substrate to manufacture the device.

10. A method of manufacturing a device using an apparatus for detecting a position of a mark from a mark signal obtained by capturing an image of the mark, the apparatus including a signal processor, wherein the signal processor is configured to set a plurality of processing windows, having centers respectively at a plurality of positions in a detection direction relative to the mark signal, to perform an orthogonal transform, of which orthogonal functions include an even function that is symmetrical with the center without including an odd function, of the mark signal in each of the plurality of processing windows to obtain an intensity of the even function with respect to each of the plurality of positions without based on an odd function, as one of the orthogonal functions, that is asymmetrical with the center, and to obtain, as the position of the mark, a position of the processing window of which an intensity of the even function has a peak value, based on the obtained intensity with respect to each of the plurality of positions, wherein the apparatus is an exposure apparatus for exposing a substrate having the mark to light, wherein the substrate has an alignment mark in which a plurality of the mark are arranged, and wherein the signal processor is configured to calculate an average of a plurality of positions respectively detected with respect to the plurality of the mark included in the alignment mark, and to determine the average as a position of the alignment mark, the method comprising:
exposing a substrate to light using the apparatus;
developing the exposed substrate; and
processing the developed substrate to manufacture the device.

11. An apparatus for detecting a position of a mark from a mark signal obtained by capturing an image of the mark, the apparatus comprising:

a signal processor;
wherein the signal processor is configured to set a plurality of processing windows having centers respectively at a plurality of positions in a detection direction relative to the mark signal, to perform an orthogonal transform, of which orthogonal functions include a plurality of even functions that are respectively symmetrical with the center, of the mark signal in each of the plurality of processing windows to obtain a total of intensities of the plurality of even functions with respect to each of the plurality of positions without based on an odd function, as one of the orthogonal functions, that is asymmetrical with the center, and to obtain, as the position of the mark, a position of the processing window of which the total has a peak value, based on the totals obtained with respect to the plurality of positions.

* * * * *